(12) United States Patent
Bottomley et al.

(10) Patent No.: US 8,717,021 B2
(45) Date of Patent: May 6, 2014

(54) SAR DOSIMETER FOR RF POWER DEPOSITION IN MRI AND METHODS AND SYSTEMS RELATED THERETO

(75) Inventors: Paul A. Bottomley, Columbia, MD (US); John P. Stralka, Ellicott City, MD (US)

(73) Assignee: The Johns Hopkins University, Baltimore, MD (US)

( * ) Notice: Subject to any disclaimer, the term of this patent is extended or adjusted under 35 U.S.C. 154(b) by 715 days.

(21) Appl. No.: 12/677,097

(22) PCT Filed: Sep. 8, 2008

(86) PCT No.: PCT/US2008/010536
§ 371 (c)(1),
(2), (4) Date: Feb. 21, 2011

(87) PCT Pub. No.: WO2009/032336
PCT Pub. Date: Mar. 12, 2009

(65) Prior Publication Data
US 2011/0148411 A1    Jun. 23, 2011

Related U.S. Application Data

(60) Provisional application No. 60/967,919, filed on Sep. 7, 2007.

(51) Int. Cl.
*G01V 3/00* (2006.01)
(52) U.S. Cl.
USPC ......................................... 324/309

(58) Field of Classification Search
USPC .................................. 324/300–322
See application file for complete search history.

(56) References Cited

U.S. PATENT DOCUMENTS

| | | | |
|---|---|---|---|
| 4,897,600 A | | 1/1990 | Hagmann et al. |
| 6,097,185 A | * | 8/2000 | Watanabe et al. ............. 324/309 |
| 6,198,285 B1 | | 3/2001 | Kormos et al. |
| 6,791,328 B1 | | 9/2004 | Nabetani et al. |
| 7,750,635 B2 | * | 7/2010 | Van Helvoort et al. ....... 324/318 |
| 7,800,368 B2 | * | 9/2010 | Vaughan et al. .............. 324/318 |

* cited by examiner

*Primary Examiner* — Dixomara Vargas
(74) *Attorney, Agent, or Firm* — Edwards Wildman Palmer LLP; Peter F. Corless; Richard B. Emmons

(57) ABSTRACT

Featured is a dosimeter device that measures SAR deposited by RF power deposition during MRI of a specimen. Such a dosimeter device includes a transducer that is configured to present a load to the MRI scanner in which the transducer is located and to provide an output representative of signals induced in the transducer. The transducer also is configured so that the presented load is substantially equivalent to another load which would be presented by the specimen during MRI of the specimen. Such a transducer also is configured so as to generate an MRI signal that is sufficient to allow the MRI scanner to adjust the RF power to a value substantially equal to that of the specimen. Also featured are methods for measuring SAR deposited by RF power deposition and apparatuses or system embodying such a dosimeter device.

20 Claims, 6 Drawing Sheets

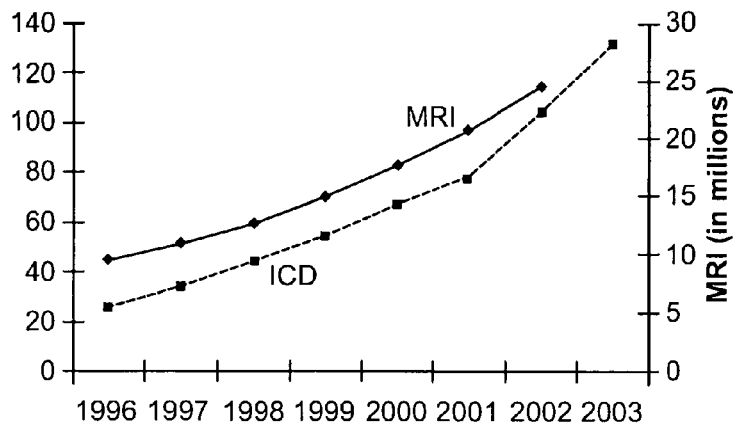

FIG. 1A

| Date of event | MRI System | Field (T) | Description | Leads[a] | Coils[b] | Bore[c] |
|---|---|---|---|---|---|---|
| 11/17/06 | GE | 1.5 | 1st° burns/blisters, both arms, ctl coil | N | Y | N |
| 11/17/06 | GE | 1.5 | burn/blisters, arm | N | N | Y |
| 11/16/06 | Philips | 1.5 | burn/blister, left forearm | Y | N | N |
| 11/2/06 | GE | 1.5 | burn/blister, arm | N | N | N |
| 11/1/06 | Philips | 1.5 | burn/blister, arm | N | N | N |
| 10/16/06 | Philips | 1.5 | burns/blisters, both thighs | N | N | N |
| 9/15/06 | GE | 1.5 | 2nd° burn, right elbow | N | N | N |
| 8/1/06 | Hitachi | 1.5 | burn, neck (ctl receive coil) | N | Y | N |
| 7/21/06 | FONAR | 0.6 | 3rd° burns, back (no padding) | Y | N | N |
| 7/14/06 | Philips | 1.5 | burns/ blisters, hip | N | N | N |
| 6/5/06 | Philips | 1.5 | burns/blisters, inner thighs | N | N | N |
| 6/9/06 | Philips | 1.5 | 2nd° burns/blisters, breast | N | N | N |
| 5/26/06 | Philips | 1.5 | burns/blisters, elbow, leg | N | N | N |
| 4/29/06 | Philips | 1.5 | burns/blisters, legs (calf) | N | N | N |
| 3/17/06 | GE | 1.5 | 2nd° burn, elbow | N | N | N |
|  |  |  | burn/blisters, hand (breast exam) | N | N | Y |
| 3/16/06 | GE | 1.5 | injury to 2 patients |  |  |  |
| 3/5/06 | Philips | 1.5 | 2nd° burns/blisters, inner thighs | N | N | N |
| 2/23/06 | Philips | 1.5 | 2nd° burns, shoulder | N | N | N |
| 2/13/06 | GE | 1.5 | burns, blisters, elbows | N | N | N |
|  |  |  |  | N | N | Y |

FIG. 1B

| Date | Mfr | T | Description | a | b | c |
|---|---|---|---|---|---|---|
| 1/24/06 | Siemens | 1.5 | burn/blister abdomen | N | Y | N |
| 12/20/05 | GE | 1.5 | 3rd° burns, hands (at isocenter) | Y | N | N |
| 12/19/05 | GE | 1.5 | burn/blisters, hand (breast exam) | Y | N | N |
| 12/11/05 | GE | 1.5 | burn/blister, chest | N | N | N |
| 12/10/05 | GE | 1.5 | 2nd° burns, arm, bicep | N | N | N |
| 11/1/05 | Siemens | 1.5 | burn/blisters on calfs | N | N | N |
| 10/26/05 | Philips | 3 | 2nd° burn, shoulder; 1sto burn, knee | N | N | N |
| 10/13/05 | GE | 1.5 | 2nd° burn lower neck | Y | N | N |
| 9/30/05 | GE | 1.5 | 2nd° RF burn, elbow | N | N | N |
| 9/23/05 | GE | 1.5 | 2nd° burns (torso array coil) | N | Y | N |
| 9/21/05 | Siemens | 1.5 | burns, fingers and thighs touching | N | N | N |
| 9/14/05 | GE | 1.5 | burn/blister, elbow | N | N | N |
| 8/27/05 | GE | 1.5 | burn/blisters, hip (8 ch body array) | N | Y | N |
| 8/23/05 | GE | 1.5 | burn/blisters, hip (8 ch body array) | N | Y | Y |
| 8/16/05 | GE | 1.5 | burn/blisters, hip (8 ch body array) | N | Y | N |
| 8/15/05 | Philips | 1.5 | burns/blisters, elbows (head MRI) | N | N | N |
| 7/22/05 | GE | 1.5 | burn, breast (lumbar MRI) | N | Y | N |
| 6/15/05 | GE |  | burns/blistering on wrist (wrist coil) | N | Y | N |
| 4/20/05 | GE |  | burns/blisters, C-spine exam | N | Y | N |
| 3/17/05 | GE | 1.5 | burns/blisters shoulder | N | N | N |
| 3/4/05 | Philips | 1.5 | burns/blister, arm (coil contact) | N | N | Y |
| 2/14/05 | GE | 1.5 | burns/blisters shoulder, elbow (shoulder array) | N | Y | N |
| 2/14/05 | GE | 1.5 | 2nd° burns, both legs (torso array) | Y | Y | N |
| 2/7/05 | Siemens | 1.5 | burn/blister arm | N | N | Y | a Report links injury to leads, including coil cables, or metal (Y = yes; N = No)
b Report notes use of surface coils/arrays during scan
c Report notes injury was associated with bore contact FIG. 1B (continued)

Peak voltage on MRI coil's end-ring capacitor

SAR DOSIMETER FOR RF POWER DEPOSITION IN MRI AND METHODS AND SYSTEMS RELATED THERETO

RELATED APPLICATIONS

This application is a 35 U.S.C. §371 U.S. national entry of International Application PCT/US2008/010536 (WO 2009/032336) having an International filing date of Sep. 8, 2008 which claims the benefit of U.S. Provisional Application Ser. No. 60/967,919 filed Sep. 7, 2007, the teachings of both applications being incorporated herein by reference in their entireties.

STATEMENT REGARDING FEDERALLY-SPONSORED RESEARCH

The present invention was supported by grants from the National Institute of Health, grant number NIH RR 15396. The U.S. Government may have certain rights to the present invention.

FIELD OF INVENTION

The present invention relates to systems, device and methods used in magnetic resonance imaging (MRI); and more particularly to methods for measuring or determining the Radio Frequency (RF) power deposited in a target of consideration (i.e., specific absorption rate—SAR) during MRI and yet more particularly to devices and methods for determining or measuring such an SAR or RF power deposition without need to know machine specific SAR performance characteristics. More specifically, the present invention relates to a scanner-independent dosimeter for measuring the RF power deposition and SAR for human MRI exposure

BACKGROUND OF THE INVENTION

There are currently over 20,000 MRI scanners performing over 60 million studies world-wide [The Nobel Prize in Physiology or Medicine. Press Release, Oct. 6, 2003. http://nobelprize.org/nobel prizes/medicine/laureates/2003/press.html]. About half of these scans are performed in the United States (US), where the number of scans has been doubling about every 3 years for the past decade (see FIG. 1A). In the US, over half of the existing scanners operate at 1.5 Tesla (1.5 T) [Bottomley P A, Hart H R, Edelstein, Schenck J F, Smith L S, Leue W M, Mueller O M, Redington R W. NMR imaging/spectroscopy system to study both anatomy and metabolism. The Lancet 1983; ii, 273-274], while most luminary institutions active in medical imaging research have added 3 T MRI systems, and 4 T [Hardy C J, Bottomley P A, Roemer P B, Redington R W. Rapid 31 P spectroscopy on a 4 Tesla whole-body system. Magn Reson Med 1988; 8: 104-109] and 7 T [Vaughan J T, Garwood M, Collins C M, Liu W, DelaBarre L, Adriany G, Andersen P, Merkle H, Goebel R, Smith M B, Ugurbil K. 7 T vs. 4 T: RF power, homogeneity, and signal-to-noise comparison in head images. Magn Reson Med 2001; 46: 24-30] whole body systems are also commercially available. While MRI is not considered a significant risk [Young F E (Food and Drug Administration). Federal Register, Mar. 9, 1988; 53: 7575-7579], it is not hazard-free.

The potential for radio frequency (RF) power deposition and heating in human MRI was realized as early as 1978 [Bottomley P A, Andrew E R. RF magnetic field penetration, phase-shift and power dissipation in biological tissue: Implications for NMR imaging. Phys Med Biol 1978; 23: 630-643]. The mechanism for heating is the induction of eddy currents in the body by the time-dependent RF magnetic field in accordance with Faraday's Law, due to the finite conductivity of the body. Models comprised of homogeneous cylinders of tissue of measured conductivity and dielectric constant, are solved analytically for various configurations. The key results are: (a) local peak and average specific power absorption rates (SARs) in W/kg or W/cm$^3$ can be determined from the known RF pulse width, duty cycle, flip-angle, and sample size using relatively simple formulae [Bottomley P A, Andrew E R. RF magnetic field penetration, phase-shift and power dissipation in biological tissue: Implications for NMR imaging. Phys Med Biol 1978; 23: 630-643; Bottomley P A, Roemer R B. Homogeneous tissue model estimates of RF power deposition in human NMR studies. Local elevations predicted in surface coil decoupling. Annal NY Acad Sci 1992; 649: 144-159; Bottomley P A, Edelstein W A. Power deposition in whole body NMR imaging. Med. Phys 1981; 8: 510-512]; (b) SAR varies approximately quadratically with MRI frequency or field strength, and with sample radius at lower frequencies (<100 MHz); and (c) peak SAR is related to the average SAR by simple numerical factors [Bottomley P A, Roemer R B. Homogeneous tissue model estimates of RF power deposition in human NMR studies. Local elevations predicted in surface coil decoupling. Annal NY Acad Sci 1992; 649: 144-159].

That excess RF power deposition can cause heating and burns is evidenced by voluntary reports to the US Food and Drug Administration (FDA) of injuries received during clinical MRI, as summarized in the tabulation provided in FIG. 1 for 2005 and 2006 [U.S Food and Drug Administration, Center for Devices and Radiological Health, MAUDE data base reports of adverse events involving medical devices. (http://www.accessdata.fda.gov/scripts/cdrh/cfdocs/cfMAUDE/search.CFM)]. Many of these injury reports are not linked to patient proximity to leads, metal, separate receiver coils, or the magnet bore, which may pose additional risk. The safety of RF exposure during clinical MRI is regulated via government and industry guidelines [Guidance for Industry and FDA Staff Criteria for Significant Risk Investigations of Magnetic Resonance Diagnostic Devices. USA Food & Drug Administration (http://www.fda.gov/cdrh/ode/guidance/793.pdf), Jul. 14, 2003; Particular requirements for the safety of magnetic resonance equipment for medical diagnosis (IEC 60601-2-33:2002). European Committee for Electrotechnical Standardization Central Secretariat: rue de Stassart 35, B—1050 Brussels]. The FDA and International Electrotechnical Commission (IEC) guidelines adopted in Europe are summarized in Table 1.

TABLE 1

IEC and FDA guidelines on SAR and heating for human MRI studies

| IEC limits (6 min average) | Whole body average | Head average | Head, trunk local SAR | Extremities local |
|---|---|---|---|---|
| Normal (all patients) | 2 W/kg (0.5° C.) | 3.2 W/kg | 10 W/kg | 20 W/kg |
| 1$^{st}$ level (supervised) | 4 W/kg (1° C.) | 3.2 W/kg | 10 W/kg | 20 W/kg |
| 2$^{nd}$ level (IRB approval) | 4 W/kg (>1° C.) | >3.2 W/kg | >10 W/kg | >20 W/kg |
| Localized Heating limit | 39° C. In 10 g | 38° C. In 10 g | | 40° C. In 10 g |

TABLE 1-continued

IEC and FDA guidelines on SAR and heating for human MRI studies

| IEC limits (6 min average) | Whole body average | Head average | Head, trunk local SAR | Extremities local |
|---|---|---|---|---|
| FDA limits | 4 W/kg for ≥15 min | 3 W/kg for ≥10 min | 8 W/kg In 1 g for ≥10 min | 12 W/kg In 1 g for ≥5 min |

RF exposure also is a factor in assessing the safety of MRI in human research overseen by Institutional Review Boards (IRBs). Consequently, accurate RF dosimetry is central to the safe operation of thousands of MRI scanners and millions of human MRI scans. Indeed, issues relating to SAR are listed among the top three unsolved problems and unmet needs by each of three study groups of the International Society of Magnetic Resonance in Medicine [Unsolved Problems and Unmet Needs in MR: Results from a survey of ISMRM Study Groups, December 2005. (http://www.ismrm.org/07/UnsolvedProblems_Results.htm)], underscoring the need for providing accurate and independent methods of measuring it.

The IEC defines the whole-body SAR as the absorbed RF power ($P_A$ in Watts) divided by patient mass (m), and the partial body SAR is calculated based on the body mass in the coil which may be modeled by homogeneous cylinders [Particular requirements for the safety of magnetic resonance equipment for medical diagnosis (IEC 60601-2-33:2002). European Committee for Electrotechnical Standardization Central Secretariat: rue de Stassart 35, B-1050 Brussels]. The local SAR in 1 g or 10 g of tissue is determined from experimentally-validated models or by experiments on phantoms. For homogeneous cylinders and spheres, the models yield a local SAR 2-4 times average, while heterogeneous models with quadrature excitation yield ratios of 4.5-6 for the head at 63-175 MHz [Collins C M, Li S, Smith M B. SAR and B1 field distributions in a heterogeneous human head model within a birdcage coil. Magn Reson Med 1998; 40: 847-856; Collins C M, Liu W Z, Wang J H, Gruetter R, Vaughan J T, Ugurbil K, Smith M B. Temperature and SAR calculations for a human head within volume and surface coils at 64 and 300 MHz. JMRI 2004; 19: 650-656; Nguyen U D, Brown J S, Chang I A, Krycia J, Mirotznik M S. Numerical evaluation of heating of the human head due to magnetic resonance imaging. IEEE Trans Biomed Eng 2004; 51: 1301-1309], and 10-16 for male and female torsos at 1.5 T and 3 T [Simunic D. Calculation of energy absorption in a human body model in a homogeneous pulsed high-frequency field. Bioelectrochem Bioenerg 1998; 47: 221-230; Liu W, Collins C M, Smith M B. Calculations of B1 distribution specific energy absorption rate and intrinsic signal-to-noise ratio for a body-size birdcage coil loaded with different human subjects at 64 and 128 MHz. Appl Magn Reson 2005; 29: 5-18]. Thus, once an average SAR is determined via $P_A$/m, a model-based local maximum can be obtained by simple multiplication by the corresponding model factor, at least for the above frequency ranges.

One simple method of measuring SAR that satisfies the IEC guidelines and does not require MRI parameters, determines $P_A$ from the incident (forward minus reflected) root-mean-square (rms) power $P_I$ at the transmitter coil. This method, however, does require that the coil's quality factors (Q) be measured with the subject load ($Q_L$), and without the subject load ($Q_U$) [Bottomley P A, Redington R W, Edelstein W A, Schenck J F. Estimating RF power deposition in body NMR imaging. Magn Reson Med 1985; 2: 336-349; Mansfield P, Morris P G. NMR imaging in Biomedicine. Academic Press, NY, 1982, p 313.20].

In this method, the amount of power deposited in the subject is determined using the following relationship:

$$P_A = P_I(1 - Q_L/Q_U).  \quad [1]$$

Although determining these parameters at each exam would provide a straightforward approach to measuring SAR, various expediencies are commonly adopted for reporting and limiting SAR in many commercial clinical MRI scanners. For example, the Q's and $P_I$ are generally not measured at the coil terminals by the scanner during set-up for a patient study, particularly in older scanners. Instead, fixed factory-determined parameters (e.g., factory software parameters) characterizing the selected coil-type are often entered into scanner configuration files to calculate the SAR for a desired duty cycle, with conservative safety factors added to accommodate variations that may occur in the field. These "scanner SAR" values are utilized by the scanner for limiting pulse sequence parameters, and are generally accessible to the MRI operator.

The accuracy with which such "scanner SAR" values measure the true average SAR may be compromised when coil Q's and power losses in the transmit line change with time, and/or when such conservative safety factors, are introduced into the scanner's SAR calculation by the manufacturer. This uncertainty is further compounded by those cases where RF burns are sustained by patients undergoing MRI as illustrated in FIG. 1 [U.S Food and Drug Administration, Center for Devices and Radiological Health, MAUDE data base reports of adverse events involving medical devices, (http://www.accessdata.fda.gov/scripts/cdrh/cfdocs/cfMAUDE/search-.CFM); Dempsey M F, Condon B, Hadley D M. Investigation of the Factors Responsible for Burns During MRI. J. Magn. Reson. Imaging 2001; 13: 627-631]. Although such cases represent a tiny fraction of the millions of clinical MRI scans performed annually, they are direct evidence that the scanner SAR was incorrect, or at least not limiting, at the time of the injury. Thus, the accuracy of scanner SARs reported by MRI scanners today, is questionable, and in any case, currently not easily verifiable independent of the scanner.

For example, and as shown in Table 2 below, some data provided from some preliminary investigations that compare scanner SARs with SARs measured from the time-derivative of the temperature response with fiber-optic probes in large gel phantoms placed in the scanner, confirm the suggestion that there is a range of error between the SAR projected using the scanner SARs versus the measured SAR.

TABLE 2

Scanner vs. measured thermal SAR (W/kg), same phantom

| Field | Scanner | SARr | Thermal SAR |
|---|---|---|---|
| 1.5T | GE | 2 | 1.34 |
| 1.5T | GE | 2 | 1.8 |

TABLE 2-continued

Scanner vs. measured thermal SAR (W/kg), same phantom

| Field | Scanner | SARr | Thermal SAR |
|---|---|---|---|
| 1.5T | Siemens | 2.4 | 1.6 |
| 1.5T | Siemens | 2 | 1.4 |
| 1.5T | Philips | 4 | 4.2 |
| 1.5T | Philips | 4 | 3 |
| 7T | (Philips) | 18.4 | 3.7 |

Indeed, if one seeks to independently measure deposited power using the above Eq. [1], access to the coil for power as well as $Q_L$ and $Q_U$ measurements is unavailable to scanner users, researchers, or medical physicists running routine checks on clinical units. Further problems arise with the testing of implanted devices, whose use in patients in need of diagnostic MRI grows exponentially. Devices that test safe at a specified scanner SAR level, may not be reliable if the scanner SAR includes unknown factors, or is scanner dependent as has been recently reported [Baker K B, Tkach J A, Nyenhuis J A, Phillips M, Shellock F G, Gonzalez-Martinez J, Rezai A R. Evaluation of specific absorption rate as a dosimeter of MRI-related Implant Heating. J. Magn. Reson. Imaging 2004; 20:315-320; Baker K B, Tkach J A, Phillips M, Rezai A R. Variability in RF-Induced Heating of a Deep Brain Stimulation Implant Across MR Systems. J. Magn. Reson. Imaging 2006; 24:1236-1242]. For example, a device testing as safe at a scanner SAR level of 4 W/kg, may in fact have only been tested at, say, 2 W/kg due to SAR being conservatively overstated. This is of particular concern, as there has been a large continuing increase in the number of patients with implanted medical devices (e.g., see FIG. 1A).

In summary: (i) if patients report burning sensations during MRI (see tabulation in FIG. 1B); or (ii) if internal device/implant makers wish to determine that their devices are safe at a certain SAR exposure level; or (iii) if questions arise during IRB assessment concerning the safe conduct of research studies, there are currently no scanner-independent means of determining whether the MRI machine is being operating within regulatory SAR guidelines, other than performing thermal testing of instrumented phantoms [Bottomley P A, Lardo A C, Tully S, Karmarker P, Viohl I. Safety and internal MRI coils. 2001 Syllabus. Special cross-specialty categorical course in Diagnostic Radiology: practical MR safety considerations for physicians, physicists, physicists and technologists. Oak Brook Ill.: Radiological Society of North America 2001; 85-90]. Such thermal testing is an involved and time consuming process.

It thus would be desirable to provide a new device or dosimeter for measuring or assessing SAR from RF deposition in MRI and methods for making such assessment using such a dosimeter. It would be particularly desirable to provide such a device and method that would allow such an assessment to be made that is scanner independent in comparison to prior art devices and techniques. Such collection devices preferably would be simple in construction and less costly to use in comparison to prior independent assessment methods and also would not require highly skilled users to utilize the device.

SUMMARY OF THE INVENTION

The present invention features a dosimeter device that measures SAR deposited by RF power deposition during MRI of a specimen. Such a dosimeter device includes a transducer that is configured to present an electrical impedance load to the MRI scanner in which the transducer is located, and to provide an output representative of signals induced in the transducer. The transducer also is configured so that the presented impedance load is substantially equivalent to a load which would be presented by the specimen during MRI of the specimen. Such a transducer also is configured so as to generate an MRI signal that is sufficient to allow the MRI scanner to adjust the RF power to a value substantially equal to which would be applied to a subject or specimen undergoing MRI evaluation. Also featured are methods for measuring SAR deposited by RF power deposition and apparatuses or system embodying such a dosimeter device.

In particular embodiments, the transducer of such a dosimeter device further includes a sample source that is configured and arranged so the signal source generates an MRI signal, sufficient to allow the MRI scanner to adjust the RF power to a value substantially equal to that of the specimen. In yet more particular embodiments, such a transducer includes an electrical impedance load including at least one loop, each loop being configured to present a desired impedance at the RF operating frequency of the MRI scanner, to the MRI scanner, when the transducer is placed in the scanner and allowed to couple with the scanner's MRI coils via mutual interactions between the intervening space. In more specific embodiments, the desired impedance is similar to that of a specimen that normally undergoes MRI and in which it is desirable to perform SAR dosimetry. In further embodiments, the transducer includes a plurality of loops, or 2 or more loops. Such loops in further embodiments, the loops are oriented so as to be in mutually orthogonal directions (for example, in the XY, XZ and YZ planes, where the Z-axis is parallel to the main MRI magnetic field). In yet further embodiments, the magnetic field strength of the MRI scanner is one of 1.0 T, 1.5 T, 3 T, 4 T and 7 T.

In further embodiments, each loop is configured to form an inductor loop and/or each loop is tuned to resonate at least one MRI frequency with at least one tuning element. In more particular embodiments, each loop includes a plurality of tuning elements that are selectively switchably connected to said each loop, wherein the tuning elements are selected by a switch so as to tune the loop for the magnetic field strength of a given MRI scanner.

In more particular embodiments, the specimen is one of a human head, a human torso, an adult human head, an adult human torso, a child human head, a child human torso, a head of a human infant, a torso of a human infant, an adult male human head, an adult male, human torso, an adult female human head, an adult female human torso, or a body-sized phantom used for testing the MRI-safety of implanted devices.

According to another aspect of the present invention there is featured a device for measuring the SAR deposited by RF power deposition during MRI of a subject for which it is desirable to perform MRI at, at least one magnetic field strength. Such a device includes a transducer means that presents a load to an MRI scanner that is substantially equivalent to the average load presented by said subject and a means for providing measurements of signals induced in said transducer. Such a device also includes a means for computing the SAR based on the signal measurements and a means of displaying the computed SAR during the course of the MRI study.

In further embodiments, such a transducer means includes at least one induction loop, and in more particular embodiments, the transducer means includes 2 or more induction loops, the induction loops being oriented so as to be in mutually orthogonal directions (XY, XZ and YZ planes). Such a transducer means also further includes a sample or phantom that generates an MRI signal, sufficient to allow the MRI scanner to automatically adjust the RF power to a value substantially equal to that of the subject or specimen.

In yet further embodiments, the induction loops are tuned to resonate at least two MRI frequencies with tuning elements and the at least two MRI frequencies correspond to magnetic field strengths of at least two of 1.0 T, 1.5 T and 3 T, and the tuning elements for each field are selected by a switch.

In yet further embodiments, the induction loops include a resistive load whose value is adjusted so as to present the substantially equivalent load of a specimen for which it is desired to perform SAR dosimetry, to the MRI scanner. Also, the subject or specimen being imaged is an adult human head/torso; a child/infant human head/torso. In addition, the means of measuring signals from the transducer, provides true rms measurements of the RF voltage; the means of computing the SAR includes multiplicative factors that provide measures of the average SAR and estimates of the peak SAR in the subject and/or the means of computing is a microprocessor, and means of display is a LCD display/meter, etc.

In yet further embodiments, the transducer is calibrated against a known applied SAR, and the means of computing applies calibration factors to permit readings of SAR in the subject over a range of MRI operating conditions that employing different RF pulse sequences.

Also featured is a method of measuring the SAR deposited by RF power deposition during MRI of a subject for which it is desirable to perform MRI at at least one magnetic field strength. Such a method includes, providing a transducer that is configured to present a load to the MRI scanner that is substantially equivalent to the average load presented by the subject or specimen and positioning the transducer in the MRI scanner. Such a method also includes connecting the transducer to a means for providing measurements of signals induced in the transducer; conducting a MRI process including generating RF signals; and computing the SAR based on the RF signal measurements.

Other aspects and embodiments of the invention are discussed below.

DEFINITIONS

The instant invention is most clearly understood with reference to the following definitions:

As used in the specification and claims, the singular form "a", "an" and "the" include plural references unless the context clearly dictates otherwise.

As used herein, the term "comprising" or "including" is intended to mean that the compositions, methods, devices, apparatuses and systems include the recited elements, but do not exclude other elements. "Consisting essentially of", when used to define compositions, devices, apparatuses, systems, and methods, shall mean excluding other elements of any essential significance to the combination. Embodiments defined by each of these transition terms are within the scope of this invention.

MRI shall be understood to mean magnetic resonance imaging (also sometimes referred to as Nuclear Magnetic Resonance Imaging—NMRI), and shall include the related field of magnetic resonance spectroscopy (MRS) which can be performed on the same instruments, and generally describes an imaging (and/or a MRS) technique that involves the transmission of radio-frequency (RF) magnetic fields into a specimen (e.g., the patient's body) while the specimen is subjected to a strong static magnetic field, wherein the RF magnetic field is tuned to excite the magnetic resonance frequency of a particular nuclear species of interest such as the nuclei of hydrogen (protons). The MRI/NMRI technique makes use of the fact that after the selected nuclei composing the specimen (e.g., hydrogen nuclei) are excited by the applied RF magnetic field, they "relax" back to equilibrium by emitting a RF magnetic field at the same frequency. The nucleus most commonly employed in magnetic resonance is the proton in the hydrogen atom, because the hydrogen nucleus has the largest magnetic moment for its spin, has the highest concentration in the body, and thus provides the strongest resonance signals. Other nuclei used include but are not limited to those of phosphorus (phosphorus-31), carbon-13, oxygen-17 and fluorine (fluorine-19). A computer analyzes the emissions from, for example, the hydrogen nuclei of water molecules in body tissues and constructs images of anatomic structures based on the concentrations of such nuclei.

The term specimen or subject shall be understood to mean any object other than the antenna/coils for transmitting the RF signals, gradient magnetic coils and related structures that are placed in the main magnetic field for imaging (MRI) analysis and shall expressly include, but not be limited to members of the animal kingdom, including vertebrates (preferably a mammal, more preferably a human); test specimens, such as biological tissue, for example, removed from such members of the animal kingdom; and inanimate objects or phantoms which may be imaged by MR techniques, or which contain water or sources of other sensitive nuclei. Mammals include, but are not limited to, mice, monkeys, humans, farm animals, sport animals, and pets.

The term patient shall be understood to include mammalians including human beings as well as other members of the animal kingdom.

The term body coils shall be understood to include any antenna that generates an RF magnetic field interesting a specimen accommodated inside antenna.

The term MR analysis shall be understood to include or embrace imaging.

USP shall be understood to mean U.S. Patent Number, namely a U.S. patent granted by the U.S. Patent and Trademark Office.

The term hard pulse shall be understood to mean an RF pulse which is non-adiabatic and non-slice/frequency selective as is known to those skilled in the art. Such pulses commonly have a short duration which may be less than or of the order of 1 msec, and a square profile.

The term adiabatic pulse shall be understood to mean adiabatic RF pulses, which are a special type of RF pulses that elicits a uniform MRI flip angle over a substantial range of amplitude in the applied magnetic field strength, or power level. This is especially useful for RF transmission from the surface body coils. See M. Garwood, K. Ugurbil, A. R. Rath, M. R. Bendall, S. L. Mitchell and H. Merkle, "Magnetic Resonance Imaging With Adiabatic Pulses Using a Single Surface Coil for RF Transmission and Signal Detection," Magnetic Resonance in Medicine, 9(1):25-34, 1989.

BRIEF DESCRIPTION OF THE DRAWING

For a fuller understanding of the nature and desired objects of the present invention, reference is made to the following detailed description taken in conjunction with the accompanying drawing figures wherein like reference character denote corresponding parts throughout the several views and wherein:

FIG. 1A is a diagrammatic view illustrating the number of patients with cardiac defibrillators (ICDs) and number of annual MRI studies in the US versus year.

FIG. 1B is a tabulation of adverse events involving RF burns in MRI scanners reported to the FDA (2005-2006). The data is reported voluntarily and does not represent the true incidence or distribution of such incidents.

DESCRIPTION OF THE PREFERRED EMBODIMENT

Figure 2A:
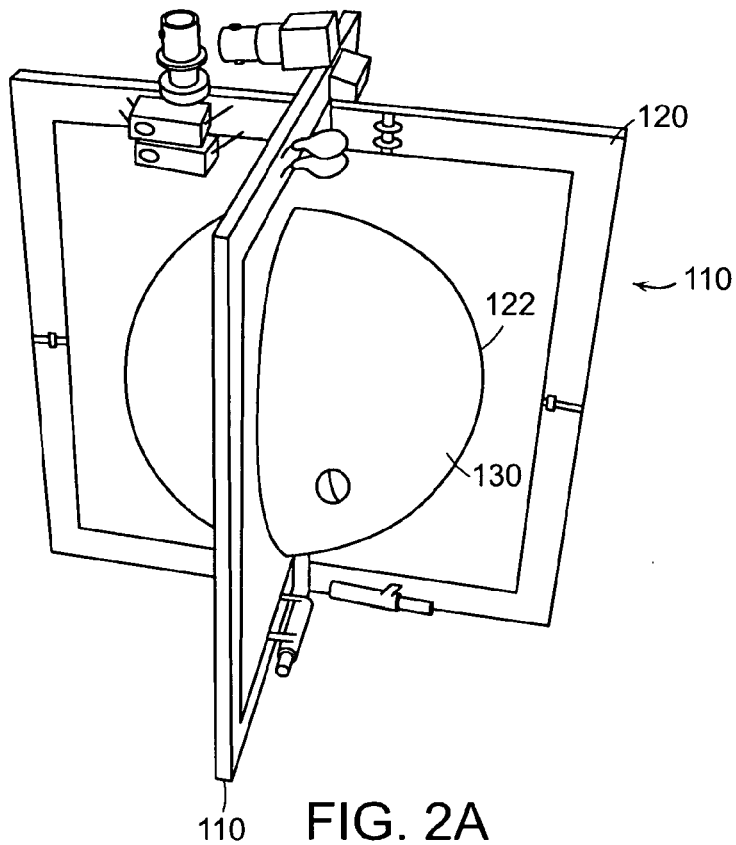
FIG. 2A is an axonometric view of an illustrative embodiment of a SAR dosimeter transducer according to the present invention.
Figure 2B:
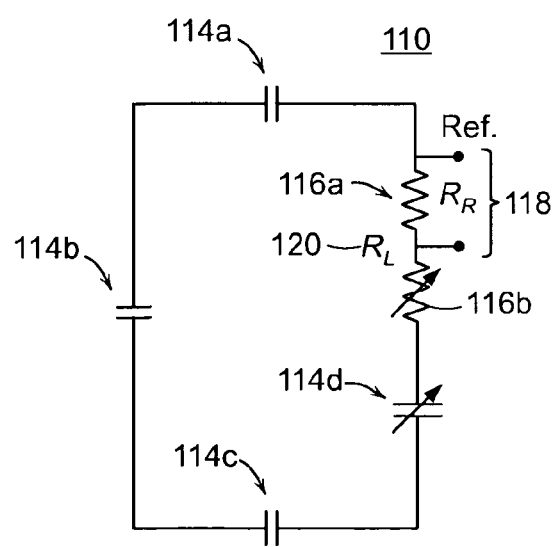
FIG. 2B is a schematic view of a circuit diagram for each loop of the SAR dosimeter transducer of FIG. 2A, where $R_L$ is the total value of the load resistance divided into a fixed reference resistor, $R_R$ and a variable resistor used to match the $Q_L$ of the transducer to that of the specimen being imaged (e.g., head, torso).

Referring now to the various figures of the drawing wherein like reference characters refer to like parts, there is shown in FIG. 2A an axonometric view of an illustrative embodiment of a SAR dosimeter transducer 100 according to the present invention and in FIG. 2B there is shown a schematic view of a circuit diagram for each loop 110 of the SAR dosimeter transducer 100 of FIG. 2A. In this illustrative embodiment, $R_L$ 120 is the total value of the load resistance that is divided into a fixed reference resistor, $R_R$ 116a and a second resistor 116b, that is used to match the $Q_L$ of the transducer to that of the particular specimen being imaged (e.g., head, torso). As described hereinafter, in more particular embodiments the second resistor is a variable resistor which provides a mechanism by which the total resistive load can be adjusted to match the $Q_L$ of the dosimeter transducer 100 to that of the specimen being imaged (e.g., head, torso).

A SAR dosimeter transducer 100 according to the present invention is configured and arranged such that the formed structure is easily accommodated in the bore of any of a number of MRI scanners and coils of such scanners as is known to those skilled in the art. In particular embodiments, the structure comprising the dosimeter transducer 100 is such that is easily accommodated in the bore of a head coil (10, FIG. 2C).

In more particular aspects, such a dosimeter transducer 100 is configured so as to include at least one loop 110 and a phantom or sample source 130. In more particular embodiments, such a dosimeter transducer 100 includes a plurality of such loops, in further embodiments 2 such loops, in yet further embodiments 3 such loops and in still yet further embodiments 2 or more such loops. In yet more particular embodiments, each of the loops 110 is oriented so the loops are arranged so as to be in mutually orthogonal directions (XY, XZ and YZ planes) to permit the detection of RF fields in any direction. In more particular embodiments, the loops 110 are each arranged or oriented orthogonal to each other to permit detection of both components of a quadrature excitation field in the XY-plane, should one exist.

Each of the at least one loops 110 also is configured and arranged (e.g., tuned), so as to resonate at, at least one MRI frequency that is associated with the magnetic field strength of the MRI scanner. Such magnetic filed strengths include 1.0 Tesla (t), 1.5 T, 3 T, 4 t and 7 T. In more particular embodiments, each of the loops forms an induction loop. In yet further particular embodiments, and as more clearly shown in FIG. 2B, each loop includes at least one tuning element 114a as is known to those skilled in the art for tuning the loop so that it resonates at the at least one MRI frequency. In further exemplary embodiments, each loop is configured with a plurality of such tuning elements 114a-d.

In yet further embodiments, a loop 110 is configured with a variable tuning construction so that the loop can be selectively tuned to more than one MRI frequency. In one embodiment, the loop 110 is configured to include an adjustable tuning element 114d that can be selectively (e.g., switchably) adjusted so as to allow the loop 110 to resonate at more than one MRI frequency. In further embodiments, the loop 110 is configured with a multiplicity of such tuning elements and these tuning elements are switchable so that a user can select an appropriate combination of tuning elements so the loop can resonate at the desired MRI frequency.

The sample source 130 is configured and arranged so as to form an MRI phantom that generates an MRI signal when the dosimeter transducer 100 is disposed in the bore of the MRI scanner. The sample source 130 is more specifically configured so that the MRI signal being generated is sufficient to allow the MRI scanner to adjust the RF power (e.g., automatically adjust) to a value substantially equal to that of the specimen to be imaged. In a more specific exemplary embodiment, the sample source 130 is a small spherical $CuSO_4$-doped water phantom that is such as to generate just enough MRI signal for the MRI scanner to adjust pulse power level and/or set-up the pulse sequence flip-angles. Although a spherical structure is illustrated, this shall not be limiting as the sample source can have any of a number of shapes as is known to those skilled in the art and appropriate for the intended MRI scan process.

In further embodiments, each of the loops 110 is mounted on a board 120 or are otherwise formed in a board, such boards include a printed circuit board acrylic board. In further embodiments, the boards 120 are formed so as to include an aperture 122 therein and the sample source 130 is disposed in the aperture, for example, by removing the center of each board 120 so as to accommodate the sample source 130. While circular apertures are illustrated, this shall not be limiting as the apertures 122 in the boards 122 are formed to create any of a number of opening shapes that are complimentary to the shape and configuration of the sample source.

The loops 110 can be formed in any of a number of shapes known to those skilled in the art, such as circular, square, hexagonal, polygonal, etc. In more particular embodiments, each of the loops 110 mounted on or formed in the boards 120 is arranged so as to generally form a square loop.

As is known to those skilled in the art, a sample or specimen is located in the bore of an MRI scanner when it is to be scanned and when so located a loaded coil quality factor is obtained which can be used in combination with an unloaded quality factor to calculate $P_A$. In the present invention, each loop 110 includes a load resistance $R_L$ 120 that is established so as to the $Q_L$ associated with the at least one loop of the transducer is substantially equivalent to the $Q_L$ of the specimen.

In illustrative embodiments the total load resistance $R_L$ 120 is divided into a fixed reference resistor, $R_R$ 116a and a second resistor 116b, that is used to match the $Q_L$ of the transducer to that of the particular specimen being imaged (e.g., head, torso). As described herein, in more particular embodiments the second resistor 116b is a variable resistor which provides a mechanism by which the total resistive load can be adjusted to match the $Q_L$ of the dosimeter transducer 100 to that of the specimen being imaged (e.g., head, torso). Stated another way, the at least one loop 110 includes a resistive load whose value is adjusted so as to present the substantially equivalent load to the MRI scanner.

Each loop 110 also includes a pair of connections or terminals 118 that are located so to measure power or voltage across the total load resistance 120. In more particular embodiment, the terminals 118 are located so as to measure power or voltage across the fixed reference resistor 116a.

Because $R_L$ can have a number of values depending on the sample load it is designed to represent, it is convenient particularly for the purpose of calibration to divide the total load resistance, $R_L$, into a smaller standard reference resistor 116a, $R_R$, in series with a load or second resistor 116b adjusted to provide the correct $Q_L$, and to measure the power in $R_R$ which also reduces the amplitude of the peak RF voltage that must be detected.

In particular embodiments, the at least one loop 110 of a transducer 100 is configured so as to create an impedance load on the MRI scanner that is equivalent to the particular body part of a patient to be scanned. For example, the patient being scanned can include an adult (male or female), a child, or an infant, each of which will load the MRI scanner differently. Thus, it is within the scope of the present invention to configure a transducer 100 so that it loads the MRI scanner for one or more different patient types and also for one or more different body parts.

In more particular embodiments, the specimen is one of a human head, a human torso, an adult human head, an adult human torso, a child human head, a child human torso, a head of a human infant, a torso of a human infant, an adult male human head, an adult male, human torso, an adult female human head, or an adult female human torso.

As it is within the scope of the present invention, for a dosimeter transducer 100 to be tuned and loaded for a particular sample size (head, body/torso etc), it is envisioned that the dosimeter transducers be manufactured for different MRI field strength, especially including the 1.0, 1.5 T and 3 T clinical MRI systems sold today, and the 4 t and 7 T systems, which are currently limited to research applications. Also the dosimeter transducers 100 would be loaded for either head, or torso/body MRI. Notwithstanding this aspect of the invention, it also is contemplated to use a single dosimeter transducer 100 that would serve for different MRI fields or ranges of MRI fields, and/or for different sample sizes such as both the head and body.

The difference between head and body loading is accommodated in a further embodiment wherein an additional multiplicative factor is included when using the head (or body) transducer in the body (or head) volume coil. Also, detectors for different sized heads/torsos are envisaged: for example adult head/body; infant head/body. The multiplicative factors are determined by calibration a priori. The user selects whether he is doing a head or a body SAR measurement. The appropriate calibration factor is applied, and the corresponding SAR measurement displayed on the meter. Embodiments wherein peak SAR is displayed by multiplying by the model factor are incorporated similarly.

Accommodating different field strengths requires different tuning elements in the circuit shown in FIG. 2B. For example, when switching from 1.5 T to 3 T field strength, the different components required to tune a loop 100, are reduced by approximately a factor of 4. Embodiments in which loop tuning elements are switched with a simple non-magnetic switch to permit use of the transducer at different fields are also included in the present invention.

The purpose of adjusting the load of the dosimeter transducer 100 to that of the particular body part (e.g., head, torso) is not to obtain measures for Eq [1], but to ensure that the scanner applies a level of RF power during set-up and MRI, that is equivalent to that which would be applied to a comparable specimen placed in the scanner for MRI. By this means, when the dosimeter is placed in the MRI scanner, it measures an SAR that is equivalent to that which the specimen would be/is exposed to. The instantaneous power deposited is measured directly from the transducer's loads after calibration: no other scanner measurements are required.

The power (Watts) measured in the dosimeter transducer 100 is proportional to $V_{rms}^2$. This must be measured over the time-course of the MRI experiment. In general, MRI denoted as the sequence repetition period TR. This period includes short periods (~1-4 ms) during which an AM and/or an FM modulated high power (>>1 KW peak) RF pulse is applied, and longer periods (~4-1000 ms) during which no RF is applied. Several different types of pulses may be applied during TR. Thus, the $V_{rms}$ determination will generally involve a measurement of the rms voltage during the $i^{th}$ RF pulse, $V_{rms}$ and the duty cycle $t_i$/TR where $t_i$ is the width of $i^{th}$ RF pulse. Thus: $V_{rms} = \Sigma V^i_{rms} \cdot t^i/TR$.

With the phantom or sample source 130 in the middle of the dosimeter transducer 100, $P_A = V_{rms}^2/R_L$, where $R_L$ is the measured resistance of the loaded loop at the RF resonant frequency. The average SAR is then just SAR=$P_A$1m with m representing an appropriate average mass of a head or torso, in accordance with the IEC definitions. However, in most cases it is prudent nonetheless to calibrate the SAR dosimeter transducer 100, such as described herein.

Figure 2C:
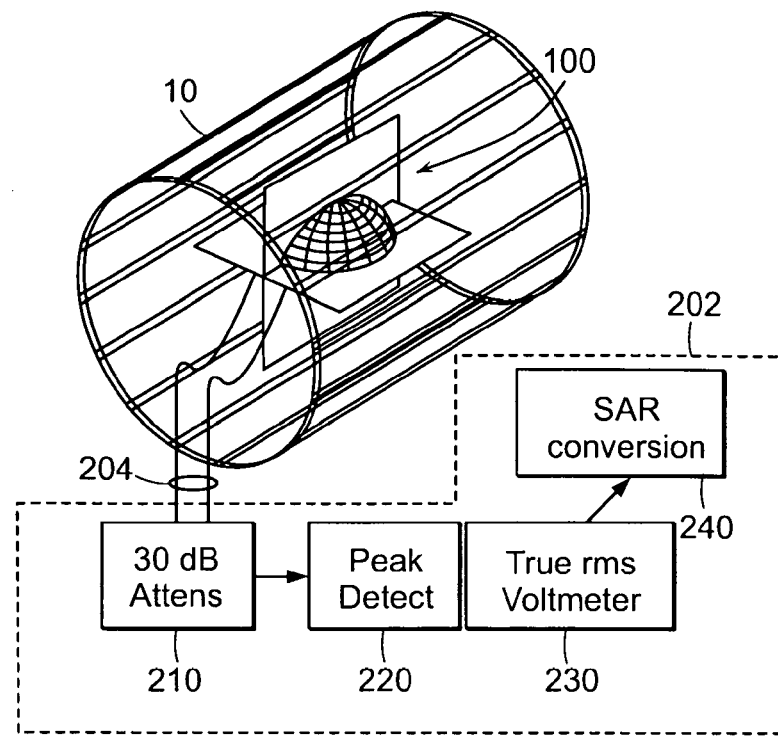
FIG. 2C is a illustrative schematic view of an apparatus for measuring SAR where the dosimeter transducer of FIG. 2A is disposed in the bore of a body coil in an MRI scanner.

Referring now to FIG. 2C there is shown an illustrative schematic view of an apparatus 200 for measuring SAR where a dosimeter transducer 100 is disposed in the bore of an MRI scanner and is operably coupled to a measuring device 202 (e.g., via interconnecting cables or communications links 204) that would be typically located outside of the bore of the scanner. In more particular embodiments, the dosimeter transducer 100 is disposed within the bore of a coil 10 of the MRI scanner. While a birdcage coil is illustrated, this shall not be considered limiting as the RF transmitting coil can have any of a number of configurations as is known to those skilled in the art.

In illustrative exemplary embodiments, such a measuring device includes a 30 dB attenuations, a peak detector 220, an rms voltmeter (e.g., true rms voltmeter) and a device 240 for converting rms voltage to SAR. In further embodiments, the SAR conversion device 240 includes any of a number of displays as is known to those skilled in the art for displaying the SAR.

As is known to those skilled in the art, an MRI scanner typically includes a computer for processing the MRI signal data so as to create an image of each slice of the specimen being imaged. Thus, it is within the scope of the present invention for the algorithm or process for determining the SAR conversion to be embodied in software or an applications program being executed on the microprocessor of the MRI scanner computer or the microprocessor of another computer.

To minimize the effects of connecting cable impedance on transducer power measurements, connection cables 204 are tuned to integral multiples of the wavelength and preferably include in-line baluns 210. In an alternative embodiment to minimize the effects of cable impedance, the leads 204 are replaced by fiber optic connections, and voltage-to-optic converters are provided on the transducer, e.g., the board 120, and powered by a small non-magnetic battery. The inputs of the converters are connected to an attenuator (e.g., 210) in turn connected to the loop load. The converter output is to the fiber optic cables, and the optical signals processed to determine the true rms voltage and compute the SAR by application of multiplicative factors as described above and herein.

A method for measuring the SAR using the measuring device 200 and dosimeter transducer 100 of the present invention can be conceptually understood from the following discussion and with reference also to FIGS. 2A-C. A dosimeter transducer 100 is selected based on the field strength or MRI frequency of the scanner; and the specimen or subject for which average measurements are required (e.g., the head or the body). In the case where the dosimeter transducer is adjustable, the dosimeter transducer is adjusted to correspond to the field strength or MRI frequency of the scanner; and to the load on the MRI scanner corresponding to the specimen or subject to be imaged.

For example, a head is replaced by the dosimeter's transducer, and the load resistors on the transducer are adjusted to produce the same Q as the head. By this means, the transducer presents an electrical load to the MRI scanner that is substantially physically equivalent to that presented by the head.

The selected dosimeter transducer 100 is then placed in the center of the MRI coil, and advanced to the normal scan position. For example, the dosimeter transducer is placed on the patient table and moved into the bore of the scanner.

The transducer is connected to the true rms voltage measuring/meter portion of the measuring device 202. This will generally be located outside the magnet, for example at the end of the patient table. The MRI scanner is started up using the desired MRI pulse sequence (for "patient weight" the average weight of the subject being measured by the dosimeter is entered).

During the MRI scan the average (and/or peak) SAR is measured from the meter and after MRI scanning the dosimeter transducer 100 is removed. Thereafter, and assuming that the measured values do not indicate that the machine is malfunctioning and should not be used, the MRI scanner is used to perform the desired MRI pulse sequence with the specimen or patient located in the bore of the scanner.

Figure 3:
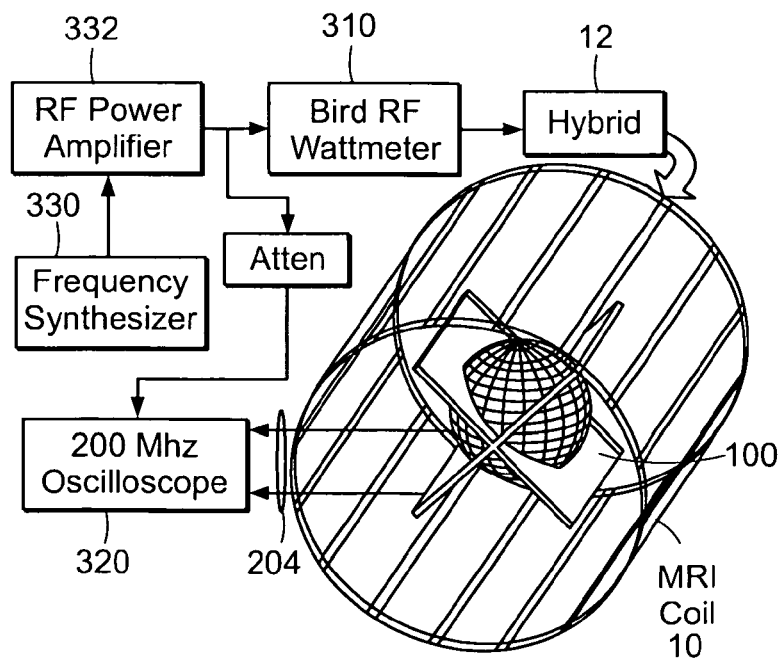
FIG. 3 is an illustrative block diagram showing use of SAR dosimeter transducer according to the present invention with an exemplary MRI coil and also used to illustrate a set-up for calibration of such a SAR dosimeter transducer.

Referring now to FIG. 3, there is shown an illustrative block diagram showing use of SAR dosimeter transducer 100 with an exemplary MRI coil 10 and also used to illustrate a set-up for calibration of such a SAR dosimeter transducer. Reference also shall be made to FIGS. 2A-C for features not otherwise described below. The set up for calibration includes a frequency synthesizer 330 (e.g., a PTS 160) that connects to an RF Power amplifier 332 (e.g., ENI MRI-2000 RF power amplifier), whose output is monitored by an RF Wattmeter 310 (e.g., a Bird 4410A RF Wattmeter) located at the input to the quadrature hybrid 12 on the MRI head coil 10. Voltage across the transducer reference resistor 116a is monitored by a 200 MHz oscilloscope 320, which is also used to crosscheck the input power (output of the RF power amplifier).

Power is calibrated by connecting the RF Wattmeter 310, capable of peak and true rms measures on the coil input, to measure $P_1$ during excitation, with the dosimeter transducer 100 in place. Bench experiments with head coils can use a continuous (cw) lower power RF amplifier (e.g., a few hundred Watts). The RF signal being inputted is synthesized using a frequency synthesizer 320 as is known to those skilled in the art and the signal is amplified using an RF power amplifier 322 as also is know to those skilled in the art.

$R_L$ is adjusted so that it produces the same value of $Q_L$ in the head coil as the specimen of interest (e.g., a head). The net power deposited in the transducer, $P_A$, which is equivalent to the net power deposited in the specimen, is then given by Eqn [1], once the input power to the coil is known. Not all of $P_A$ is deposited in $R_L$: power is deposited in the other resistor and a small amount in the phantom, for example. The fraction of the total power deposited in the load is a calibration factor for the meter for that particular specimen load and field strength.

As indicated herein, the RF voltage with rms value $V_{rms}$, is induced on the transducer during MRI, in direct proportion to the input RF voltage, and is measured with an RF oscilloscope 320 or alternatively using a true rms RF voltmeter. $P_1$ is plotted against $v_{rms}^2$ while power is applied to the MRI coil. This curve should be linear with gradient $1/R_L$. Calibration procedure is repeated for each dosimeter. Once the dosimeter power, which is equivalent to the power deposited in the average body, is known, the IEC body average SAR, $P_A/m$ obtains with m being the standard adult average weight which we will measure.

Although we have illustrated with FIG. 3 calibration of the dosimeter at the bench, the dosimeter can also be calibrated using an MRI scanner directly. This is more practical when dealing with heavy body MRI coils that are attached to the scanner, and/or where the electrical properties of MRI coils differ slightly between the bench and the magnet (e.g., due to magnet interactions). In this case power amplifier 332 and source 330 are omitted and replaced by the scanner internal connections to the MRI coil. The dosimeter transducer 100 with appropriate $R_L$ is placed in the coil, a Wattmeter (e.g., 310) connected at the coil input, and $P_1$ measured as in the bench case. $P_A$ is then determined from Eq. [1], and the calibration factor relating the power in $R_L$ to $P_A$ determined.

The IEC's "exposed body SAR" is derived using mean girth measurements to calculate the mean body mass enclosed by the coils for the average adult, and dividing $P_A$ by that as done previously. Peak SAR is obtained from the relationship between average and peak SAR determined by modeling. For homogeneous cylinders and spheres, the models yield a local SAR 2-4 times average [Bottomley P A, Roemer R B. Homogeneous tissue model estimates of RF power deposition in human NMR studies. Local elevations predicted in surface coil decoupling. Annal NY Acad Sci 1992; 649: 144-159]. Heterogeneous models with quadrature excitation yield ratios of 4.5-6 for the head at 63-175 MHz [see: Collins C M, Li S, Smith M B. SAR and B1 field distributions in a heterogeneous human head model within a birdcage coil. Magn Reson Med 1998; 40: 847-856; Collins C M, Liu W Z, Wang J H, Gruetter R, Vaughan J T, Ugurbil K, Smith M B. Temperature and SAR calculations for a human head within volume and surface coils at 64 and 300 MHz. JMRI 2004; 19: 650-656; Nguyen U D, Brown J S, Chang I A, Krycia J, Mirotznik M S. Numerical evaluation of heating of the human head due to magnetic resonance imaging. IEEE Trans Biomed Eng 2004; 51: 1301-1309], and 10-16 for male and female torsos at 1.5 T and 3 T [see: Simunic D. Calculation of energy absorption in a human body model in a homogeneous pulsed high-frequency field. Biolelectrochem Bioenerg 1998; 47: 221-230. Liu W, Collins C M, Smith M B; Calculations of B1 distribution specific energy absorption rate and intrinsic signal-to-noise ratio for a body-size birdcage coil loaded with different human subjects at 64 and 128 MHz. Appl Magn Reson 2005; 29: 5-18]. Thus, once an average SAR is determined via $P_A/m$, a model-based local maximum can be obtained by simple multiplication by the corresponding model factor, at least for the above frequency ranges. The scaling factor for determining the peak from the average SAR measured by the dosimeter will thus depend on the field strength of the dosimeter and the particular specimen being studied.

Example 1

Methods

Figure 4:
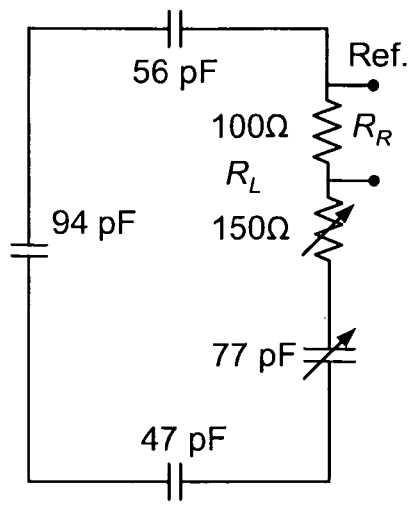
FIG. 4 is a schematic view of an illustrative circuit diagram for a loop of an illustrative SAR dosimeter transducer, where $R_L$ is the total value of the load resistance divided into a fixed reference resistor, $R_R$ and a variable resistor used to match the $Q_L$ of the transducer to that of the head.

Transducer:

A prototype 1.5 T SAR dosimeter transducer that is accommodated in the bore of a head coil for measuring average head SAR, is fabricated from two 18-cm square copper loops, affixed to acrylic board. The loops are oriented orthogonal to each other to permit detection of both components of a quadrature excitation field in the XY-plane, should one exist. They are tuned to the 1.5 T MRI frequency, and loaded with resistors. The center of each board is removed to accommodate a small spherical $CuSO_4$-doped water phantom whose only purpose is to generate just enough MRI signal for the scanner to adjust its pulse power level and/or set-up the pulse sequence flip-angles. The transducer formed by each loop is such as that illustrated in FIG. 2A and the circuit diagram of the loop is shown in FIG. 4.

To determine the value of the total load resistance, $R_L$, for each loop such that the transducer presents a load equivalent to that of the head to the MRI scanner, $Q_U$ and $Q_L$, of a standard GE 1.5 T Signa MRI quadrature birdcage head-coil are measured with the heads of a number of volunteers, and the average head $Q_L$ is determined. The head is replaced by the dosimeter transducer, and the load resistance on the transducer is adjusted to reproduce the average head $Q_L$. Different head coils will, of coarse, have different Q's, but all that is required is that the transducer produces the same $Q_L$, in each head coil that the average head produces. This is experimentally tested with Q measurements of different head coils. Note that the net load resistance presented to the head coils by the transducer after calibration of $R_L$ is greater than $R_L$ by an amount attributable to the water phantom and other losses in the dosimeter.

Figure 5:
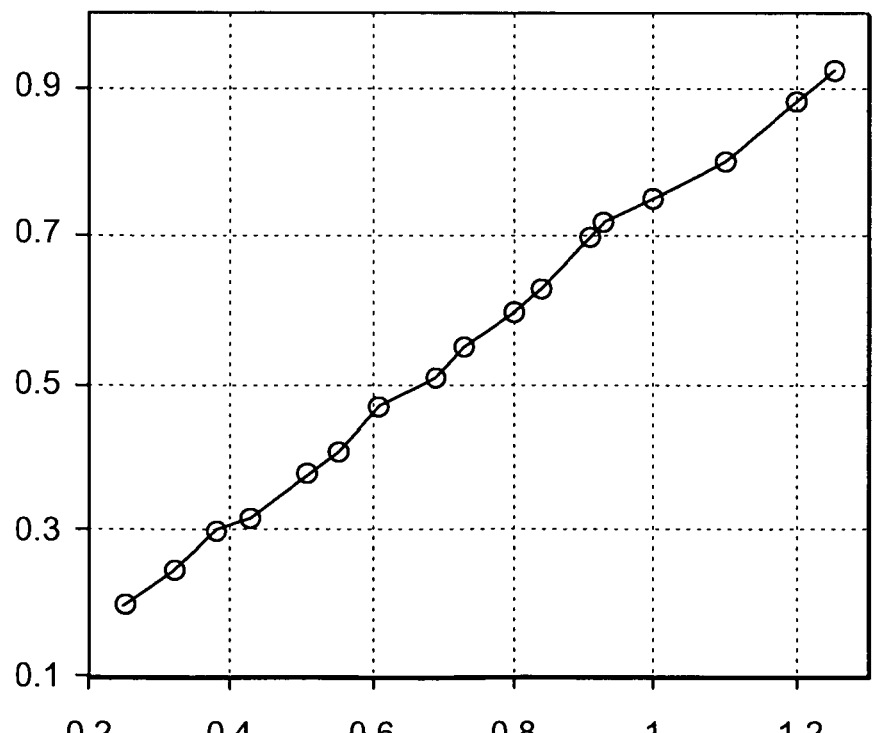
FIG. 5 is a diagrammatic view of the induced RF voltage measured across the loop load resistor, as a function of RF voltage applied to the MRI head coil.

Power Measurement:

With the head-coil connected to the scanner and the transducer inside the MRI coil, a RF voltage with rms value $V_{rms}$, is induced on the transducer during MRI, in direct proportion to the input RF voltage. This can be measured with an RF oscilloscope, or true rms RF voltmeter as exemplified in FIG. 5. The power on the head-equivalent transducer measures the total power in the head after calibration. Indeed, if power losses in the water phantom and monitoring leads are negligible, the total power deposited in the transducer loops is equal to the power deposited in the head. $P_A$ measured in the transducer is proportional to $V_{rms}^2$ over the time-course of the MRI experiment.

MRI typically utilizes a pulse sequence that repeats with period $T_R$. This period includes short periods (~1-4 ms) during which one or more type of AM and/or FM modulated high power (>>1 KW peak) RF pulses are applied, separated by longer periods (~4-1000 ms) during which no RF is applied. Thus, determining $V_{rms}$ will generally involve a measurement of the rms voltage during the $i^{th}$ RF pulse, $v^i_{rms}$ and the duty cycle $\tau_i/T_R$ where $\tau_i$ is the width of $i^{th}$ RF pulse. Thus for each loop:

$$V_{rms} = \Sigma_i v^i_{rms} \tau_i / T_R \qquad [2]$$

With the phantom in the middle of the transducer, the total power deposited in the two loops is:

$$P_A = [V_{rms}^2/R_L]_{loop1} + [V_{rms}^2/R_L]_{loop2} \qquad [3]$$

where $R_L$ is the measured total resistance of each loaded transducer loop at the RF frequency. The average SAR is then just $P_A/m$ with m as the average head mass, in accordance with the IEC definitions.

In most cases it is prudent, however, to calibrate the SAR dosimeter by measuring the power in the resistive load of each transducer loop as a function of the total power deposited in the dosimeter. Because $R_L$ can have a number of values depending on the sample load it is designed to represent, it is convenient for the purpose of calibration to divide the total load resistance, $R_L$, into a smaller standard reference resistor, $R_R$, in series with a load adjusted to provide the correct $Q_L$, and to measure the power in $R_R$ which also reduces the amplitude of the peak RF voltage that must be detected. To minimize the effects of connecting cable impedance on transducer power measurements, connection cables are tuned to integral multiples of the wavelength and preferably include in-line baluns.

Calibration:

The SAR dosimeter is calibrated independent of the MRI scanner, by connecting a true rms RF Wattmeter or RF voltmeter to the MRI coil input to measure $P_I$ during excitation, with the dosimeter placed in the coil. Bench experiments with head MRI coils can use a continuous wave (cw) RF amplifier of lower power than the scanner's peak power (e.g., a few hundred Watts) but which still produces average SAR levels that are comparable to those used in MRI. Different power levels, $P_I$ are applied to the MRI coil, and the fraction of that power deposited in the dosimeter, $P_A$, is determined from Eqn. [1]. $P_A$ is plotted against either $V_{rms}^2$ or the power measured by an rms Wattmeter in each transducer loop. The result is a linear calibration curve relating the observed power deposited in the dosimeter's load resistors, to the actual power deposited in the dosimeter in Watts. The IEC "exposed body SAR" can be derived using mean girth measurements to calculate the mean body mass enclosed by the coils for the average adult, and dividing $P_A$ by that, as reported previously. Peak SAR is obtained from the model factor relating average and peak SAR. A block diagram of the complete dosimeter placed in a standard MRI "birdcage" RF coil for calibration is depicted in FIG. 3.

Protocol for Use:

The SAR dosimeter is used as follows. The SAR transducer is placed in the scanner and MRI coil whose SAR is being measured, and advanced to the normal scan position. The transducer is connected to a true rms RF voltage or power measuring device outside the magnet (e.g., at the end of the patient table). The scanner is started using the MRI pulse sequence for which the SAR measurement is desired, entering the average weight of the load for which the dosimeter is calibrated for, as the "patient weight". The rms power is measured during MRI, and the average (and/or peak) SAR for the average subject is calculated using the average subject mass and average-to-peak model factor. The transducer is removed and replaced by a subject for scanning.

Figure 6:
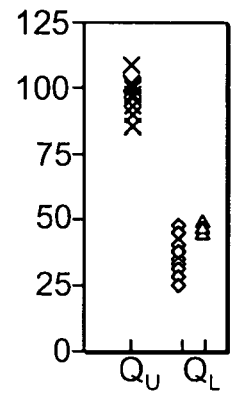
FIG. 6 is a diagrammatic view of the unloaded (crosses) and loaded 1.5 T head coil Q's loaded with the human head (diamonds), and with the dosimeter (triangles) adjusted to provide a loaded Q equal to one human heads for comparing the loaded Q's with the head and dosimeter in different head coils.

Results:

To test dosimeter feasibility, $Q_L$ and $Q_U$ measurements are performed on 9 adult co-investigators positioned in a standard GE 1.5 T head coil (baluns intact) on a metal-free bench. These data are plotted in FIG. 6. Mean $Q_U$ was 97±6. $Q_L$, was 35±6. The transducer load resistance is easily adjusted to produce the same loading. The maximum head circumference (c) and head length (chin-to-top; l) are also recorded from the group and used to estimate the average head mass exposed to the coil for the group, assuming a prolate spheroid with neutral specific gravity. This yields $m_h = lc^2/6\pi = 3.95 \pm 0.33$ kg.

To test whether, once the load is set, the transducer exerts the same loading effect as the head on different head coils with different Q's, the transducer load was set to match that of an inventor, and Q measurements repeated with the standard GE head coil from another 1.5 T scanner, without changing the load. The results summarized in Table 4, show that although Q varies from coil-to-coil, the load presented by the dosimeter probe remains equivalent to the head used to calibrate the load (49.2 vs 50.9; 65.5 vs 65.0; 98 Vs 102; 130 vs 131).

TABLE 4

Coil Q's with transducer & head.

| | | Measurements | |
|---|---|---|---|
| Condition | Head Coil | MHz | Q |
| Unloaded | MRI 1 | 64.4 | 102.6 ± 0.9 |
| | MRI 4 | 64.1 | 135.4 ± 1.1 |
| | MRI 1A | 64.4 | 205 |
| | MRI 4A | 64.1 | 271 |
| Loaded with human head | MRI 1 | 63.9 | 49.2 ± 0.6 |
| | MRI 4 | 64.0 | 65.5 ± 0.5 |
| | MRI 1A | 63.9 | 98 |
| | MRI 4A | 64.0 | 131 |
| Loaded, SAR transducer | MRI 1 | 64.2 | 50.9 ± 0.4 |
| | MRI 4 | 64.1 | 64.1 ± 0.4 |
| | MRI 1A | 64.2 | 102 |
| | MRI 4A | 64.1 | 130 |

Figure 7:
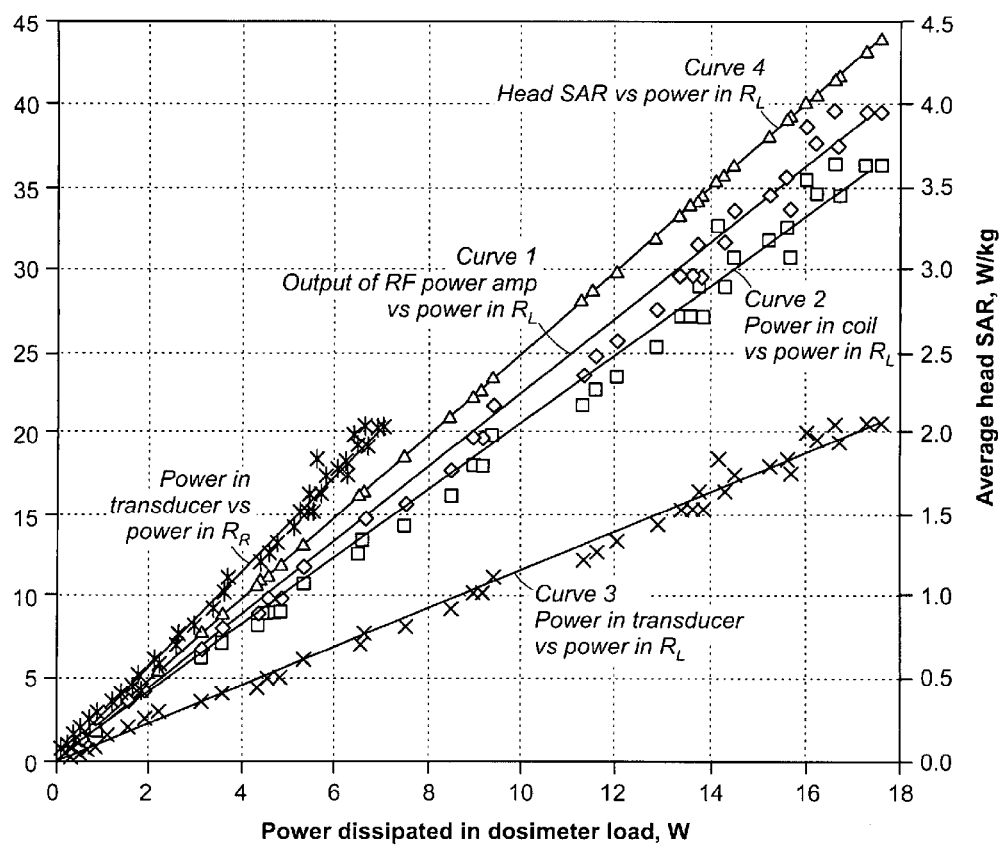
FIG. 7 is a diagrammatic view showing power and SAR measurements from a prototype SAR dosimeter. The measured output power from the RF amplifier (diamonds and line of best fit—curve 1), the measured input power to the birdcage coil (incident minus reflected power; squares and line—curve 2), and the total power deposited in the transducer as deduced from Eqn [1] (crosses and line—curve 3), all as a function of the power measured on the dosimeter load $R_L$ on the horizontal axis. Curve 3 relating actual-to-measured power in the dosimeter, is used for calibration. The line corresponding to curve 4 (triangles) plots the SAR (vertical axis at right) for the average head in W/kg, as a function of the power measured in $R_L$ on the horizontal axis.

The calibration set-up as shown in FIG. 3 was used to test and calibrate the dosimeter using ENI 300L and ENI MRI-2000 RF power amplifiers operating at continuous RF power levels of ≤3 W and ≤40 W rms power levels, respectively. The power losses ar each stage of set up are detailed in FIG. 7.

Of a maximum of 40 W output from the MRI-2000 power amplifier, about 35 W arrives at the coil, of which only about 20 W is deposited in the dosimeter's transducer, with about 17 W going into the load, $R_L$. The curve relating the net power deposited in the dosimeter to the power deposited in $R_L$ is used for calibration. Thus, 86% of the power attributable to the dosimeter based on the Q measurements and Eqn. [1] is deposited in $R_L$, and the net power deposited in the head-equivalent load is 1.16 times the power measured in $R_L$: this is the dosimeter's calibration factor. The 3 W difference in power deposited in the transducer vs that in $R_L$ is attributable to losses in the water phantom and elsewhere in the transducer's loops, connectors and structure. The measured and actual deposited power in $R_L$ are in linear proportion to the input power. The standard deviation of the measurements from the calibration curve is 5% (excluding 2 outliers), which constitutes the predicted error in using the dosimeter for measuring power. However, the scatter in the data at higher power levels here is primarily due to instability in the RF power amplifier operating in continuous mode, and not to the dosimeter or measurement devices per se. The lower curve relates the power measured in the dosimeter's reference load, to the average SAR in the $m_h$=3.95 kg head on the right hand scale.

Discussion:

There is presented and demonstrated the feasibility of a novel SAR dosimeter for measuring the average SAR for a subject whose load it mimics, with bench measurements employing different coils and subject loading. In practice, the interaction between volume MRI coils and the scanner bore that typically alter MRI coil resonant frequencies, also necessitate that transducer tuning and final calibration be performed in the scanner or in a scanner-equivalent bore. Once calibrated for a given load and MRI frequency, the dosimeter provides SAR measurements that are independent of the MRI scanner. The present inventors are aware of no other scanner-independent SAR dosimeters for MRI.

Independent determinations of the deposited power using Eqn. [1], require direct access to the coil ports during MRI to measure incident power, $Q_L$ and $Q_U$ during an exam, which is generally not feasible for scanner users and patient protocols (but can be available to the makers of test equipment such as of the present dosimeter). However, access to the bore is readily available for researchers or medical physicists performing routine safety assessment, and the proposed dosimeter is amenable to such practice since no such connections are required. The purpose of adjusting the dosimeter's load to that of the head (or body) is not to obtain measures for Eq [1], but to ensure that the scanner applies a level of RF power during set-up and MRI that is equivalent to that applied to a standard head (or body). The rms power deposited is measured directly from the transducer's loads: no other scanner measurements are required.

In the present case, the need for an independent SAR assessment was prompted by a loss of confidence in "scanner SAR" values for setting up MRI safety evaluations of devices being developed for implantation, as well as a need to provide an independent means of assessing scanner function when investigating RF burns in an albeit small number of clinical MRI cases—reported to our Medical Physicist. Even so, RF power deposition in MRI is far less of a risk than that posed by ionizing radiation in nuclear scanning, PET, X-ray, and CT, where failure to independently monitor exposure would not be an option.

While the above described SAR dosimeter concept was tested with a head prototype at 1.5 T, the importance of RF dosimetry increases with field and body size, upon which SAR depends approximately quadratically. Thus, at fields of 3 T and higher, the IEC and FDA guidelines already limit the use of some MRI pulse sequences that are in routine clinical use at lower fields. Thus, a preferred embodiment of the present invention is a transducer in the magnet that is connected to a meter that reads SAR directly such as shown in FIG. 2C. This involves incorporating the calibration factor into the meter, with allowance for the entry of different scaling factors to permit SAR measurement in different study groups.

Although a preferred embodiment of the invention has been described using specific terms, such description is for illustrative purposes only, and it is to be understood that changes and variations may be made without departing from the spirit or scope of the following claims.

INCORPORATION BY REFERENCE

All patents, published patent applications and other references disclosed herein are hereby expressly incorporated by reference in their entireties by reference.

EQUIVALENTS

Those skilled in the art will recognize, or be able to ascertain using no more than routine experimentation, many equivalents of the specific embodiments of the invention described herein. Such equivalents are intended to be encompassed by the following claims.

What is claimed is:

1. A dosimeter device for measuring SAR deposited by RF power deposition during MRI of a specimen for which it is desirable to perform MRI at, at least one magnetic field strength, said dosimeter device comprising:
   a transducer that is configured to present a load to an MRI scanner in which the transducer is located and to provide an output representative of signals induced in the transducer; and
   wherein the transducer is configured so that the presented load is substantially equivalent to another load which would be presented by the specimen during MRI of the specimen.

2. The dosimeter device of claim 1, wherein the transducer includes a sample source that is configured and arranged so the signal source generates an MRI signal, sufficient to allow the MRI scanner to adjust the RF power to a value substantially equal to that of the specimen.

3. The dosimeter device of any of claims 1, wherein the transducer includes at least one loop, each loop being configured to receive RF signals from the MRI scanner.

4. The dosimeter device of claim 3, wherein the transducer includes 2 or more loops.

5. The dosimeter device of claim 3, wherein the transducer includes 2 or more loops, where the loops are oriented so as to be in mutually orthogonal directions (XY, XZ and YZ planes).

6. The dosimeter device of any of claims 3-5, wherein each loop is configured to form an induction loop.

7. The dosimeter device of any of claims 3-5, further including at least one tuning element wherein each loop is tuned to resonate at least one MRI frequency.

8. The dosimeter device of any of claims 1, wherein the magnetic field strength of the MRI scanner is one of 1.0 T, 1.5 T, 3 T, 4 T and 7 T.

9. The dosimeter device of claim 8, wherein each loop includes a plurality of tuning elements that are selectively switchably connected to said each loop, wherein the tuning elements are selected by a switch so as to tune the loop for the magnetic field strength of a given MRI scanner.

10. The dosimeter device of any of claims 1, wherein said specimen is one of a human head, a human torso, an adult human head, an adult human torso, a child human head, a child human torso, a head of a human infant, a torso of a human infant, an adult male human head, an adult male, human torso, an adult female human head, an adult female human torso, or a phantom used for testing the MRI safety of implanted devices.

11. A device for measuring the SAR deposited by RF power deposition during MRI of a subject for which it is desirable to perform MRI at, at least one magnetic field strength, said device comprising:
   transducer means in which signals are generated during MRI and that presents a load to an MRI scanner that is substantially equivalent to an average load presented by the subject;
   means for providing measurements of signals induced in said transducer;
   means for computing the SAR based on the signal measurements; and
   means for displaying the computed SAR during the course of the MRI study.

12. The device of claim 11, wherein the transducer means includes at least one induction loop.

13. The device of claim 12, wherein the transducer means includes 2 or more induction loops, the induction loops being oriented so as to be in mutually orthogonal directions (XY, XZ and YZ planes).

14. The device of claim 12, wherein the induction loops are tuned to resonate at, at least one MRI frequency with tuning elements.

15. The device of claim 14, wherein the at least one magnetic field strength means that generates a magnetic field having a field strength of at least 1.0 T, 1.5 T, 3 T, 4 T and 7 T, and the tuning elements for each field are selected by a switch.

16. The device of claim 14, wherein the induction loops include a resistive load whose value is adjusted so as to present the substantially equivalent load to the MRI scanner.

17. The device of claim 11, wherein the transducer means includes a sample that generates an MRI signal, sufficient to allow the MRI scanner to automatically adjust the RF power to a value substantially equal to that of said subject.

18. The device of claim 11, where the subject is an adult human head/torso; a child/infant human head/torso.

19. A method of measuring the SAR deposited by RF power deposition during MRI of a subject for which it is desirable to perform MRI at least one magnetic field strength, said method comprising the steps of:
   providing a transducer that is configured to present a load to the MRI scanner that is substantially equivalent to the average load presented by the subject;
   positioning the transducer in the MRI scanner;
   connecting the transducer to a means for providing measurements of signals induced in the transducer;
   conducting a MRI process including generating RF signals;
   computing the SAR based on the RF signal measurements to measure the SAR deposited by the RF power deposition and displaying the measured SAR.

20. The method of claim 19, wherein the means for providing measurements of signals induced in said transducer includes converting to an optical signal for conveyance to via fiber optic cable, and wherein means of computing the SAR based on the signal measurements includes calculation of the SAR from digital fiber-optic signals.

* * * * *